United States Patent
Liu et al.

(10) Patent No.: US 10,453,686 B2
(45) Date of Patent: Oct. 22, 2019

(54) IN-SITU SPACER RESHAPING FOR SELF-ALIGNED MULTI-PATTERNING METHODS AND SYSTEMS

(71) Applicant: Tokyo Electron Limited, Minato-ku, Tokyo (JP)

(72) Inventors: Eric Chih-Fang Liu, Guilderland, NY (US); Angelique Raley, Halfmoon, NY (US); Akiteru Ko, Schenectady, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 15/486,928

(22) Filed: Apr. 13, 2017

(65) Prior Publication Data

US 2018/0061640 A1     Mar. 1, 2018

Related U.S. Application Data

(60) Provisional application No. 62/382,110, filed on Aug. 31, 2016.

(51) Int. Cl.
*H01L 21/033* (2006.01)
*H01L 21/311* (2006.01)
*H01L 21/02* (2006.01)

(52) U.S. Cl.
CPC .... *H01L 21/0337* (2013.01); *H01L 21/02274* (2013.01); *H01L 21/31116* (2013.01)

(58) Field of Classification Search
CPC ........... H01L 21/0337; H01L 21/02274; H01L 21/31116
See application file for complete search history.

(56) References Cited

U.S. PATENT DOCUMENTS

| | | | |
|---|---|---|---|
| 9,257,280 B2 | 2/2016 | Ko et al. | |
| 9,293,341 B2 | 3/2016 | Chang | |
| 9,640,409 B1 * | 5/2017 | Yang | H01L 21/0337 |
| 2016/0247883 A1 * | 8/2016 | He | H01L 21/02488 |

* cited by examiner

*Primary Examiner* — Nadine G Norton
*Assistant Examiner* — Mahmoud Dahimene
(74) *Attorney, Agent, or Firm* — Wood Herron & Evans LLP (57) ABSTRACT

Methods and systems for in-situ spacer reshaping for self-aligned multi-patterning are described. In an embodiment, a method of forming a spacer pattern on a substrate may include providing a substrate with a spacer. The method may also include performing a passivation treatment to form a passivation layer on the spacer. Additionally, the method may include performing spacer reshaping treatment to reshape the spacer. The method may also include controlling the passivation treatment and spacer reshaping treatment in order to achieve spacer formation objectives.

21 Claims, 10 Drawing Sheets

FIG. 10

IN-SITU SPACER RESHAPING FOR SELF-ALIGNED MULTI-PATTERNING METHODS AND SYSTEMS

CROSS-REFERENCE TO RELATED APPLICATIONS

This application is related to and claims priority to U.S. Provisional Application No. 62/382,110, filed Aug. 31, 2016, the entire contents of which are herein incorporated by reference.

BACKGROUND OF THE INVENTION

Field of Invention

The present invention relates to systems and methods for substrate processing, and more particularly to in-situ spacer reshaping for self-aligned multi-patterning methods and systems.

Description of Related Art

Self-Aligned Multi-Patterning (SAMP) techniques have been used for formation of components of fin-type field effect transistor (FinFET) devices, and the like. Dimension shrinkage is a one of the driving forces in the development of integrated circuit processing. By reducing the size dimensions, cost-benefit and device performance boosts can be obtained. This scalability creates inevitable complexity in process flow, especially on patterning techniques. SAMP techniques have been widely adapted in sub-22 nm FinFETs architecture, and it uses extra spacer etch steps to achieve pitch reduction requirements. Conventional SAMP flow has several steps, including core etch, spacer deposition, spacer etch and core pull. In this approach, the final feature critical dimension (CD) is controlled by spacer deposition thickness and spacer physical features, such as line edge roughness (LER) and line width roughness (LWR).

With the conventional SAMP approaches, spacer etch often suffers distortion of the final spacer profile such as spacer facet and CD loss. It is, however, important to sustain the spacer profile and CD, because spacer profile has a substantial impact on pitch-walking effect, mask budget and CD targeting on the final structure.

Further issues with prior processing techniques include spacer height loss due to non-uniform etch and lack of selectivity between the gate core material and the spacer material. Additionally, inadequate etch of spacer material may result in spacer footings, core-to-spacer step height differences, and the like. Such manufacturing defects may cause further device defects, reduce product production rates, limit the scale of manufacturable devices, etc.

SUMMARY OF THE INVENTION

Methods and systems for in-situ spacer reshaping for self-aligned multi-patterning are described. In an embodiment, a method of forming a spacer pattern on a substrate may include providing a substrate with a spacer. The method may also include performing a passivation treatment to form a passivation layer on the spacer. Additionally, the method may include performing spacer reshaping treatment to reshape the spacer. The method may also include controlling the passivation treatment and spacer reshaping treatment in order to achieve spacer formation objectives.

A system for forming a spacer pattern on a substrate may include an ion etch chamber configured to: receive a substrate with a spacer, perform a passivation treatment to form a passivation layer on the spacer, and perform performing spacer reshaping treatment to reshape the spacer. Additionally, the system may include a controller coupled to the ion etch chamber, the controller configured to control the passivation treatment and spacer reshaping treatment in order to achieve spacer formation objectives.

BRIEF DESCRIPTION OF THE DRAWINGS

The accompanying drawings, which are incorporated in and constitute a part of this specification, illustrate embodiments of the invention and, together with the general description of the invention given above, and the detailed description given below, serve to describe the invention.

DETAILED DESCRIPTION OF EMBODIMENTS OF THE INVENTION

Methods and systems for in-situ spacer reshaping for self-aligned multi-patterning are described. However, one skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention.

Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale. In referencing the figures, like numerals refer to like parts throughout.

Reference throughout this specification to "one embodiment" or "an embodiment" or variation thereof means that a particular feature, structure, material, or characteristic described in connection with the embodiment is included in at least one embodiment of the invention, but does not denote that they are present in every embodiment. Thus, the appearances of the phrases such as "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

Additionally, it is to be understood that "a" or "an" may mean "one or more" unless explicitly stated otherwise.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

As used herein, the term "substrate" means and includes a base material or construction upon which materials are formed. It will be appreciated that the substrate may include a single material, a plurality of layers of different materials, a layer or layers having regions of different materials or different structures in them, etc. These materials may include semiconductors, insulators, conductors, or combinations thereof. For example, the substrate may be a semiconductor substrate, a base semiconductor layer on a supporting structure, a metal electrode or a semiconductor substrate having one or more layers, structures or regions formed thereon. The substrate may be a conventional silicon substrate or other bulk substrate comprising a layer of semi-conductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

Referring now to the drawings, where like reference numerals designate identical or corresponding parts throughout the several views.

Figure 1:
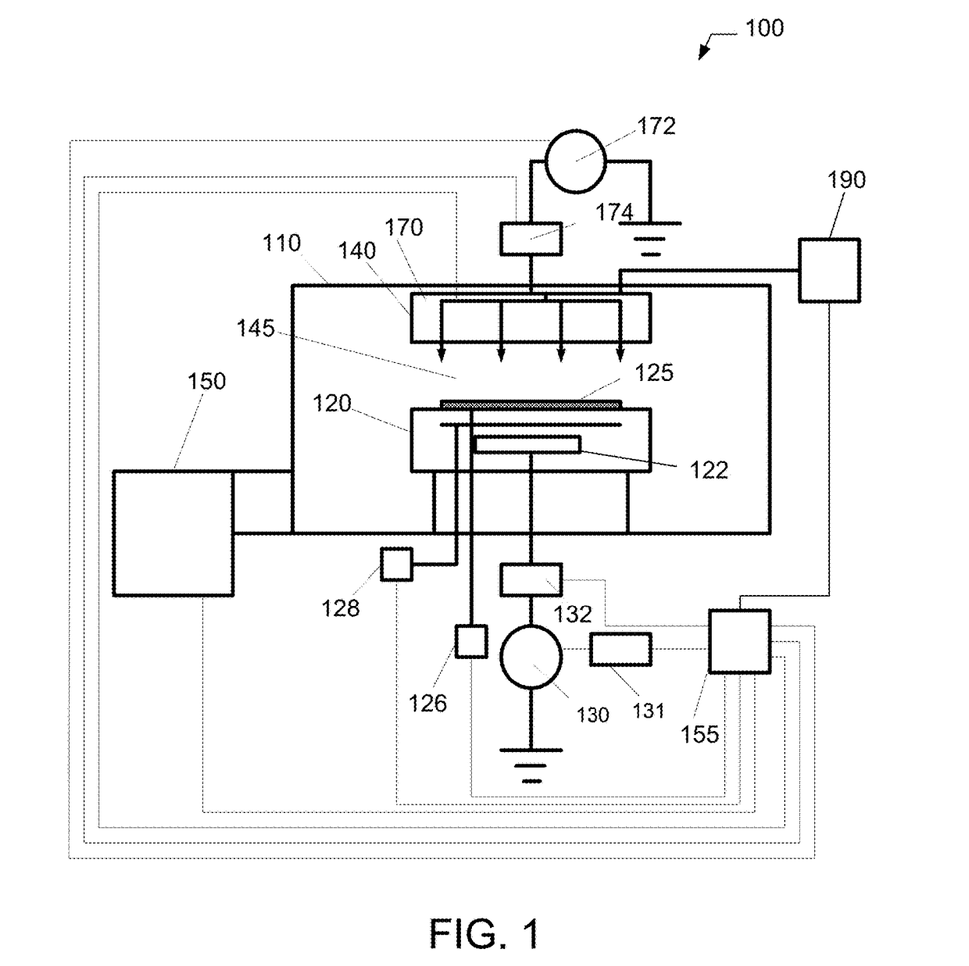
FIG. 1 is a schematic block diagram illustrating one embodiment of a plasma etch system configured for in-situ spacer reshaping for self-aligned multi-patterning methods and systems.

FIG. 1 is an embodiment of a system 100 for in-situ spacer reshaping for self-aligned multi-patterning. In a further embodiment, the system may be configured to perform in-situ spacer reshaping for self-aligned multi-patterning as described with reference to FIGS. 2A-9. An etch and post heat treatment system 100 configured to perform the above identified process conditions is depicted in FIG. 1 comprising a processing chamber 110, substrate holder 120, upon which a wafer 125 to be processed is affixed, and vacuum pumping system 150. The wafer 125 can be a semiconductor substrate, a wafer, a flat panel display, or a liquid crystal display. Processing chamber 110 can be configured to facilitate etching the processing region 145 in the vicinity of a surface of the wafer 125. An ionizable gas or mixture of process gases is introduced via a gas distribution system 140. For a given flow of process gas, the process pressure is adjusted using the vacuum pumping system 150.

The wafer 125 can be affixed to the substrate holder 120 via a clamping system (not shown), such as a mechanical clamping system or an electrical clamping system (e.g., an electrostatic clamping system). Furthermore, substrate holder 120 can include a heating system (not shown) or a cooling system (not shown) that is configured to adjust and/or control the temperature of substrate holder 120 and the wafer 125. The heating system or cooling system may comprise a re-circulating flow of heat transfer fluid that receives heat from substrate holder 120 and transfers heat to a heat exchanger system (not shown) when cooling, or transfers heat from the heat exchanger system to substrate holder 120 when heating. In other embodiments, heating/cooling elements, such as resistive heating elements, or thermo-electric heaters/coolers can be included in the substrate holder 120, as well as the chamber wall of the processing chamber 110 and any other component within the system 100.

Additionally, a heat transfer gas can be delivered to the backside of wafer 125 via a backside gas supply system 126 in order to improve the gas-gap thermal conductance between wafer 125 and substrate holder 120. Such a system can be utilized when temperature control of the wafer 125 is required at elevated or reduced temperatures. For example, the backside gas supply system can comprise a two-zone gas distribution system, wherein the helium gas-gap pressure can be independently varied between the center and the edge of wafer 125.

In the embodiment shown in FIG. 1, substrate holder 120 can comprise an electrode 122 through which RF power is coupled to the processing region 145. For example, substrate holder 120 can be electrically biased at a RF voltage via the transmission of RF power from a RF generator 130 through an optional impedance match network 132 to substrate holder 120. The RF electrical bias can serve to heat electrons to form and maintain plasma. In this configuration, the system 100 can operate as a reactive ion etch (RIE) reactor, wherein the chamber and an upper gas injection electrode serve as ground surfaces.

Furthermore, the electrical bias of electrode 122 at a RF voltage may be pulsed using pulsed bias signal controller 131. The RF power output from the RF generator 130 may be pulsed between an off-state and an on-state, for example. Alternately, RF power is applied to the substrate holder electrode at multiple frequencies. Furthermore, impedance match network 132 can improve the transfer of RF power to plasma in plasma processing chamber 110 by reducing the reflected power. Match network topologies (e.g. L-type, π-type, T-type, etc.) and automatic control methods are well known to those skilled in the art.

Gas distribution system 140 may comprise a showerhead design for introducing a mixture of process gases. Alternatively, gas distribution system 140 may comprise a multi-zone showerhead design for introducing a mixture of process gases, and adjusting the distribution of the mixture of process gases above wafer 125. For example, the multi-zone showerhead design may be configured to adjust the process gas flow or composition to a substantially peripheral region above wafer 125 relative to the amount of process gas flow or composition to a substantially central region above wafer 125. In such an embodiment, gases may be dispensed in a suitable combination to form a highly uniform plasma within the processing chamber 110.

Vacuum pumping system 150 can include a turbo-molecular vacuum pump (TMP) capable of a pumping speed up to about 8000 liters per second (and greater) and a gate valve for throttling the chamber pressure. In conventional plasma processing devices utilized for dry plasma etching, an 800 to 3000 liter per second TMP can be employed. TMPs are useful for low pressure processing, typically less than about 50 mTorr. For high pressure processing (i.e., greater than about 80 mTorr), a mechanical booster pump and dry roughing pump can be used. Furthermore, a device for monitoring chamber pressure (not shown) can be coupled to the plasma processing chamber 110.

In an embodiment, the source controller 155 can comprise a microprocessor, memory, and a digital I/O port capable of generating control voltages sufficient to communicate and activate inputs to system 100 as well as monitor outputs from system 100. Moreover, source controller 155 can be coupled to and can exchange information with RF generator 130, pulsed bias signal controller 131, impedance match network 132, the gas distribution system 140, the gas supply 190, vacuum pumping system 150, as well as the substrate heating/cooling system (not shown), the backside gas supply system 126, and/or the electrostatic clamping system 128. For example, a program stored in the memory can be utilized to activate the inputs to the aforementioned components of system 100 according to a process recipe in order to perform a plasma assisted process, such as a plasma etch process or a post heating treatment process, on wafer 125.

In addition, the system 100 can further comprise an upper electrode 170 to which RF power can be coupled from RF generator 172 through optional impedance match network 174. A frequency for the application of RF power to the upper electrode can range from about 0.1 MHz to about 200 MHz, in one embodiment. Alternatively, the present embodiments may be used in connection with Inductively Coupled Plasma (ICP) sources, Capacitive Coupled Plasma (CCP) sources, Radial Line Slot Antenna (RLSA) sources configured to operate in GHz frequency ranges, Electron Cyclotron Resonance (ECR) sources configured to operate in sub-GHz to GHz ranges, and others. Additionally, a frequency for the application of power to the lower electrode can range from about 0.1 MHz to about 80 MHz. Moreover, source controller 155 is coupled to RF generator 172 and impedance match network 174 in order to control the application of RF power to upper electrode 170. The design and implementation of an upper electrode is well known to those skilled in the art. The upper electrode 170 and the gas distribution system 140 can be designed within the same chamber assembly, as shown. Alternatively, upper electrode 170 may comprise a multi-zone electrode design for adjusting the RF power distribution coupled to plasma above wafer 125. For example, the upper electrode 170 may be segmented into a center electrode and an edge electrode.

Depending on the applications, additional devices such as sensors or metrology devices can be coupled to the processing chamber 110 and to the source controller 155 to collect real time data and use such real time data to concurrently control two or more selected integration operating variables in two or more steps involving deposition processes, RIE processes, pull processes, profile reformation processes, heating treatment processes and/or pattern transfer processes of the integration scheme. Furthermore, the same data can be used to ensure integration targets including completion of post heat treatment, patterning uniformity (uniformity), pull-down of structures (pulldown), slimming of structures (slimming), aspect ratio of structures (aspect ratio), line width roughness, substrate throughput, cost of ownership, and the like are achieved.

By modulating the applied power, typically through variation of the pulse frequency and duty ratio, it is possible to obtain markedly different plasma properties from those produced in continuous wave (CW). Consequently, RF power modulation of the electrodes can provide control over time-averaged ion flux and the ion energy.

Figure 2A:
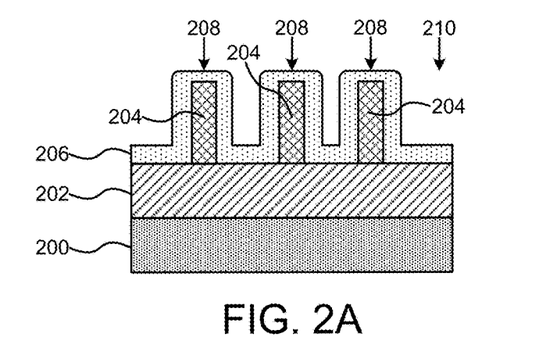
FIG. 2A is a schematic cross-section diagram illustrating one embodiment of a work piece for spacer formation.
Figure 2B:
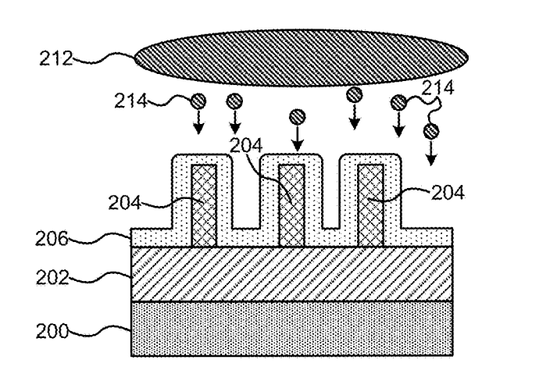
FIG. 2B is a schematic cross-section diagram illustrating one embodiment of a work piece for spacer formation.
Figure 2C:
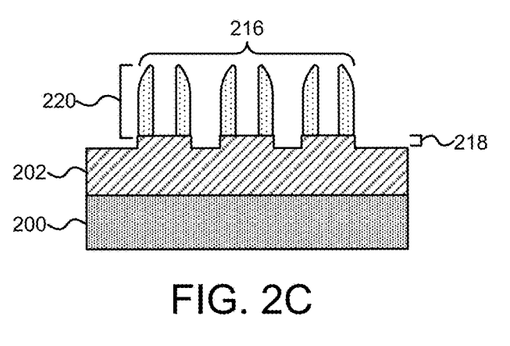
FIG. 2C is a schematic cross-section diagram illustrating one embodiment of a work piece for spacer formation.

One embodiment of a spacer etch process is described in FIGS. 2A-2C. In an embodiment, the workpiece includes a substrate 200 with a hardmask 202 formed thereon, the hardmask 202 having one or more spacer cores 204 and a conformal layer 206 of spacer material formed thereon. In an embodiment, the conformal layer 206 may include one or more etch surfaces 208 disposed over the spacer cores 204. In an embodiment, the conformal layer 206 may be etched in an etch direction 210. In one such embodiment, the wafer 125 may comprise the substrate 200. The hardmask 202 may comprise a material, such as a nitride layer for covering the substrate 200, which may be patterned and etched using the spacers 216 as shown in FIGS. 3A-3B and 5A-5B.

In an embodiment, the substrate 200 may be formed of materials comprising silicon or gallium arsenide. The hardmask layer 202 may be formed of materials, including oxide, nitride, metal oxide, and metal nitride. The spacer cores 204 may comprise materials, including silicon, amorphous carbon, photoresist, oxide, nitride, and the like. The conformal layer 206 may comprise materials, including oxide, nitride, silicon, metal oxide, and metal nitride.

In the step of FIG. 2B, the conformal layer 206 and the spacer cores 204 may be etched using a reactive ion etch process. In the reactive ion etch process, a plasma field 212 comprising one or more reactive ions 214 may be formed over the workpiece. In such an embodiment, the reactive ions 214 may open the etch surfaces 208 and selectively etch the spacer cores 204. Following the reactive ion etch process, the workpiece of FIG. 2C may be formed.

Figure 2D:
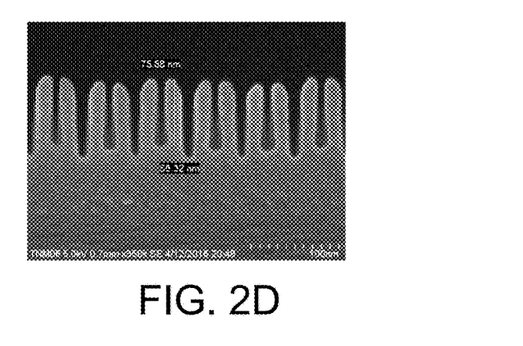
FIG. 2D is a cross-section x-ray image of one embodiment of a work piece for spacer formation.

In the embodiment of FIG. 2C, a plurality of spacers 216 may be formed. Each spacer 216 may have a height 220, which is significantly reduced from the original spacer height due to the heavy ion etch. Additional spacer footings may be left in the trenches between spacers 216 as a result of insufficient etch selectivity. Also, core-to-spacer height difference 218 into the substrate 202 may be a result of the ion etch process. In an embodiment, the core-to-spacer height difference 218 may be associated with the time required to etch the spacer core 204. FIG. 2D is a cross-section x-ray image of one embodiment of a spacer etch process as illustrated in FIG. 2C.

Figures 3A, 3C:
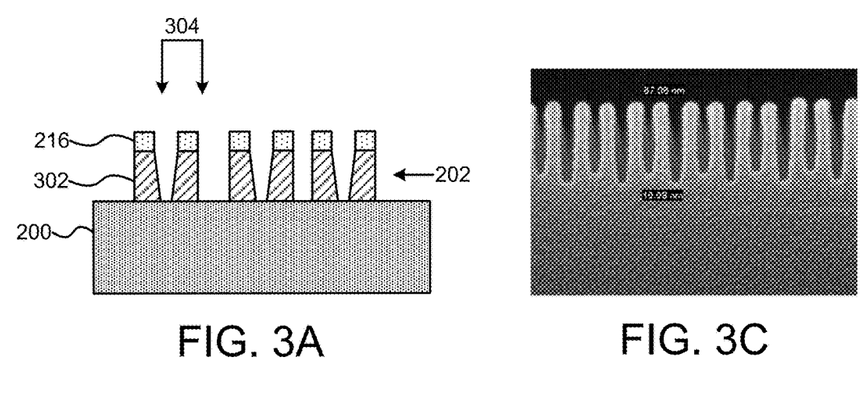
FIG. 3A is a schematic cross-section diagram illustrating one embodiment of a work piece for formation of a feature in a substrate.
FIG. 3C is a cross-section x-ray image of one embodiment of a work piece for formation of a feature in a substrate.

FIG. 3A is a schematic cross-section diagram illustrating one embodiment of a work piece for formation of a feature in a substrate. In the embodiment of FIG. 3A, a portion of the hardmask layer 202 may be etched to form a patterned mask 302. In various embodiments, etching the substrate is performed using a plasma etch gas chemistry that may include one or more of $N_2$, $O_2$, CO, $CO_2$, $H_2$, HBr, $Cl_2$, $C_xH_y$, Ar, He, $C_xH_yF_z$, and $C_xF_y$.

As illustrated in FIG. 3A, the patterned mask 302 may include defects due to the defects in the spacer formation described above, the spacer 216 being formed proximate the hardmask layer 202. For example, spacer shape may have a significant impact on pattern transfer because of the small spaces between spacers. Hardmask profile deformation has been found between core and space sites during experimentation. Such hardmask deformation may cause CD shift—also referred to as "pitchwalking"—substrate profile shift, and depth loading 308, as shown in FIG. 3B.

Figures 3B, 3D:
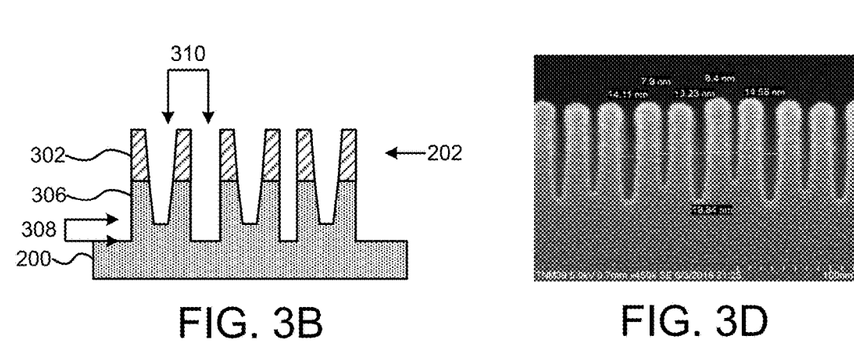
FIG. 3B is a schematic cross-section diagram illustrating one embodiment of a work piece for formation of a feature in a substrate.
FIG. 3D is a cross-section x-ray image of one embodiment of a work piece for formation of a feature in a substrate.

In the example of FIGS. 3A-3B, deformations in the post-substrate etch are evident, as shown in the cross-section x-ray image of FIG. 3C. As illustrated, the process may include etching the substrate 200 in a pattern defined by the patterned mask 302 of the hardmask layer 202 for forming a physical feature 306 in the substrate 200. In an embodiment, the physical structure may be a fin for a finFET device. In an embodiment, etching the substrate is performed using a plasma etch gas chemistry that includes one or more of $N_2$, $O_2$, CO, $CO_2$, $H_2$, HBr, $Cl_2$, $C_xH_y$, Ar, He, $C_xH_yF_z$, and $C_xF_y$. FIG. 3D is a cross-section x-ray image illustrating an embodiment of the result of the process illustrated in FIG. 3B.

Figure 4A:
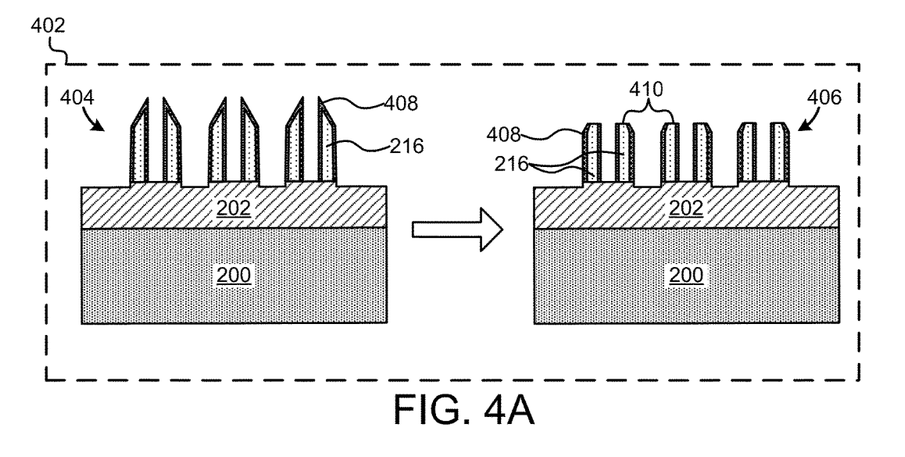
FIG. 4A is a schematic cross-section diagram illustrating one embodiment of a process for enhanced formation of a feature in a substrate.

FIG. 4A is a schematic cross-section diagram illustrating one embodiment of a spacer treatment process 402 for enhanced formation of a physical feature 306 in the substrate 200. In one embodiment, the spacer treatment process 402 includes a passivation treatment 404 and a spacer reshaping treatment 406. In the passivation treatment 404, the spacer 216 is covered with a passivation layer 408. In one embodiment, the passivation layer 408 may be an oxide layer or a nitride layer. If, in one embodiment, the spacer material is a nitride material, the passivation layer 408 may be an oxide material. Alternatively, if the spacer material is an oxide material, the passivation layer 408 may be a nitride material. In some embodiments, the passivation layer 408 may be formed by chemical vapor deposition (CVD). In a further embodiment, the CVD process may be plasma assisted CVD. In such an embodiment, the passivation treatment is performed using a plasma gas chemistry that includes one or more of $N_2$, $O_2$, CO, $CO_2$, $H_2$, $C_xH_y$, $C_xH_yF_z$, Ar, He, and other suitable gases.

In an embodiment, the spacer reshaping treatment 406 is performed using a plasma etch. In the spacer reshaping treatment 406, an etch gas chemistry is selected to etch the spacer material faster than the passivation material. For example, the plasma etch is performed using a plasma etch gas chemistry that includes N2, O2, CO, CO2, H2, HBr, Cl2, CxHy, Ar, He, CxHyFz, CxFy, and other suitable gases. Thus, the spacer 216 may be reshaped according to a predetermined reshaping profile. In one embodiment, the spacer treatment includes flattening an end 410 of the spacer 216 that is distal to the substrate 200. The present embodiments were specifically tested with a mixture of $CHF_3$, $O_2$, and Ar, which produced favorable results as compared with the results shown in FIGS. 3A-3B.

Flow rate ranges for various gasses described herein are listed in Table 1. All flow rates in Table 1 are measured in standard cubic centimeters per minute (sccm).

TABLE 1

| Flow rate ranges for ion gasses. | |
| --- | --- |
| Gas | Range |
| $CHF_3$ | 14~250 sccm |
| $O_2$ | 3~390 sccm |
| Ar | 70~1400 sccm |
| $CH_3F$ | 4~90 sccm |
| $N_2$ | 15~300 sccm |
| $CH_4$ | 3~65 sccm |
| $SO_2$ | 12~250 sccm |
| HBr | 30~600 sccm |
| $CF_4$ | 10~400 sccm |

Figure 4B:
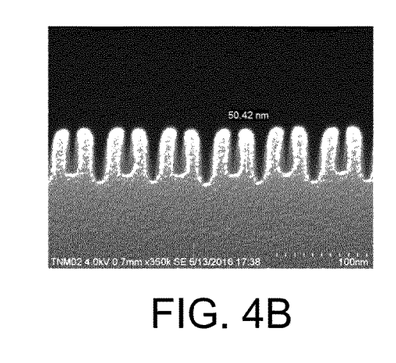
FIG. 4B is a cross-section x-ray image of one embodiment of a work piece for enhanced formation of a feature in a substrate.

In an embodiment, the range of chamber pressures of gasses in Table 1 may be 3 mT~300 mT. In an embodiment, high frequency power produced by the RF generator 172 may be in the range of 0 W~1500 W, and low frequency power generated by the power supply 130 may be in the range of 0 W~1000 W. In an embodiment, the temperature within the processing chamber 110 may be in the range of −10 C~110 C. FIG. 4B is a cross-section x-ray image of a result of one embodiment of the spacer treatment process 402.

Figure 5A:
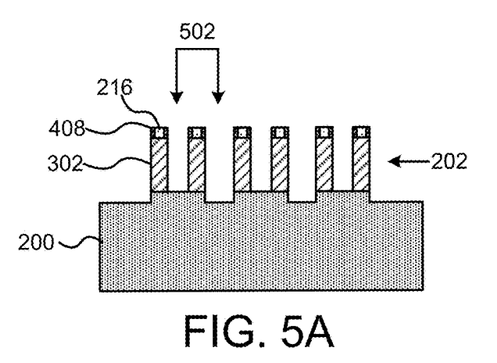
FIG. 5A is a schematic cross-section diagram illustrating one embodiment of a work piece for enhanced formation of a feature in a substrate.
Figure 5B:
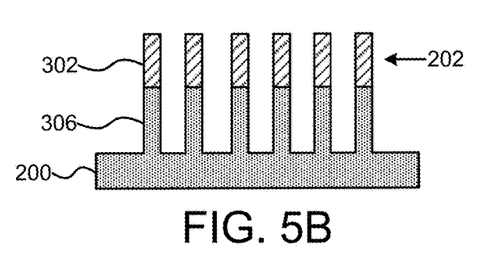
FIG. 5B is a schematic cross-section diagram illustrating one embodiment of a work piece for enhanced formation of a feature in a substrate.
Figure 5C:
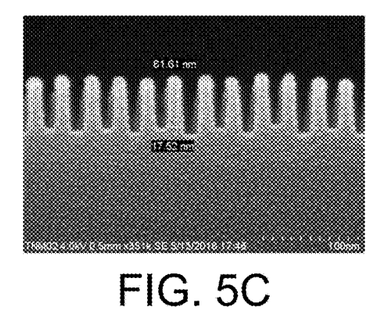
FIG. 5C is a cross-section x-ray image of one embodiment of a work piece for enhanced formation of a feature in a substrate.
Figure 5D:
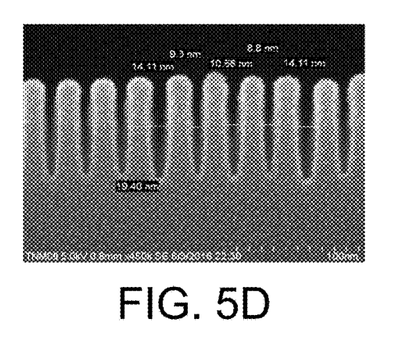
FIG. 5D is a cross-section x-ray image of one embodiment of a work piece for enhanced formation of a feature in a substrate.

FIGS. 5A-5B illustrate a schematic cross-section diagram illustrating one embodiment of a work piece for enhanced formation of a feature in a substrate. The embodiments of FIG. 5A-5B illustrate the result of the formation process in response to the spacer treatment process 402 illustrated in FIG. 4A. The reshaped spacer 216 and passivation layer 408 may provide a patterned layer for forming the patterned mask 302 as described in FIG. 3A. In the embodiment of FIG. 5A, however, the profile 502 of the hardmask is greatly improved, when compared to the result of FIG. 3A. The cross-section x-ray image of FIG. 5C confirms the result of the process illustrated in FIG. 5A. Accordingly, the CD pitchwalking issues are substantially resolved. Similarly, the formed physical feature 306 in the substrate 200 may be significantly improved with respect to pitchwalking, substrate profile shift, and depth loading, as compared with the result of FIG. 3B. These results are confirmed by the x-ray image illustrated in FIG. 5D, which corresponds to the illustration of FIG. 5B.

Figure 6A:
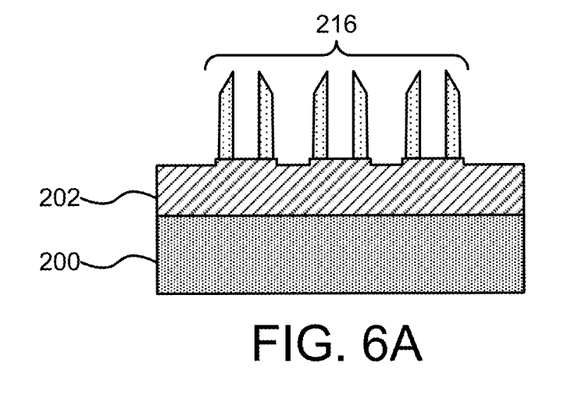
FIG. 6A is a schematic cross-section diagram illustrating one embodiment of a work piece illustrating an embodiment of a passivation process for enhanced formation of a feature in a substrate.
Figure 6B:
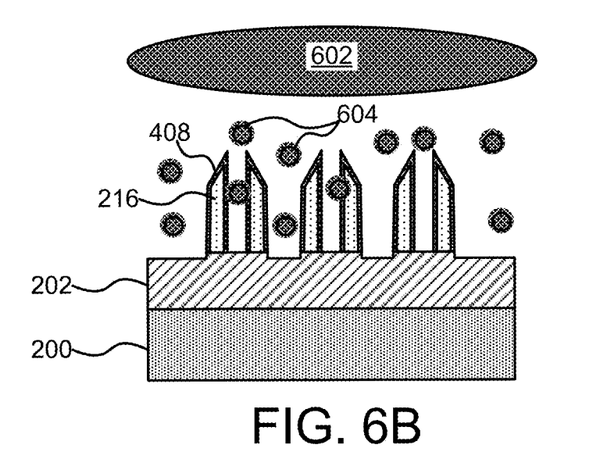
FIG. 6B is a schematic cross-section diagram illustrating one embodiment of a work piece illustrating an embodiment of a passivation process for enhanced formation of a feature in a substrate.

Further details of the passivation treatment 404 are illustrated in FIGS. 6A-6B. As illustrated in FIG. 6A, the workpiece may include one or more spacers 216 created by an etch and core pull process described in FIG. 2B. As shown in FIG. 6B, a plasma field 602 may be formed proximate the workpiece. In various embodiments, the plasma field 602 may be formed with $N_2$ or $O_2$ gas, depending upon the composition of the spacer material, thereby introducing nitrogen or oxygen ions 604 in the area proximate the spacer 216. Thus, a nitride or oxide passivation layer 408 may be formed on the spacer 216.

Figure 7A:
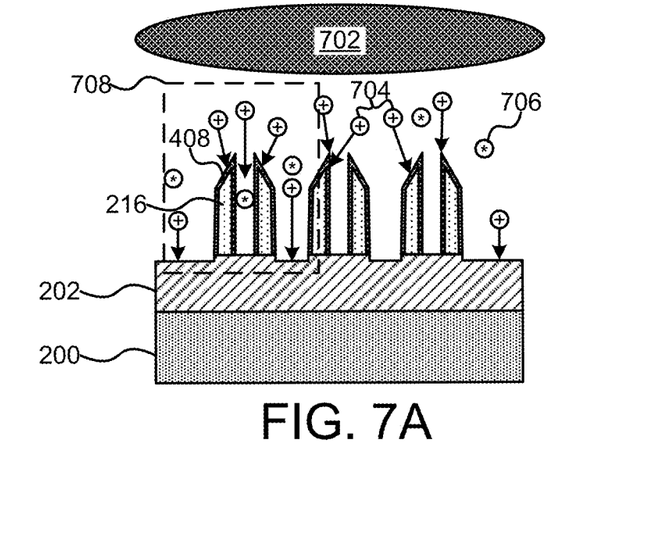
FIG. 7A is a schematic cross-section diagram illustrating one embodiment of a work piece illustrating an embodiment of a spacer reshaping process for enhanced formation of a feature in a substrate.
Figure 7B:
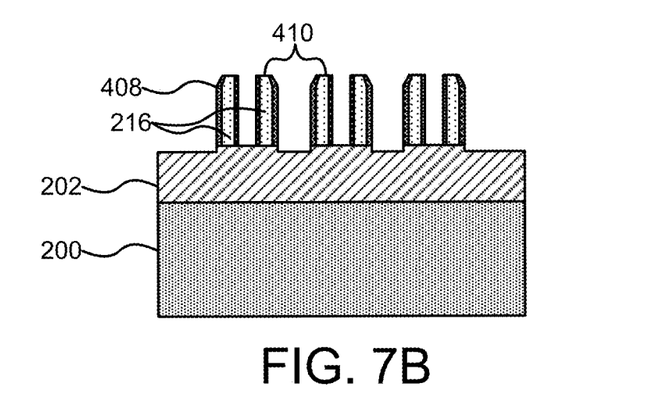
FIG. 7B is a schematic cross-section diagram illustrating one embodiment of a work piece illustrating an embodiment of a spacer reshaping process for enhanced formation of a feature in a substrate.

FIGS. 7A-7B illustrate further details of the spacer radical elements 706. As illustrated in FIG. 7A, a plasma field 702 may be formed in a region proximate the workpiece. The plasma field 702 may include ionic elements 704 and radical elements 706. The ionic elements 704 may strike into the spacer 216, breaking through the tip of the passivation layer 408 and into the spacer material. In such an embodiment, the spacer material may be etched faster than the passivation material as further illustrated in FIGS. 8A-8C for the portion of the workpiece within box 708. FIG. 7B illustrates the post-reshape result of the reshaping process illustrated in FIG. 7A. As illustrated, the spacer 216 may have a reshaped region 410. For example, in one embodiment, the reshaped region 410 may be a flattened portion on the top of the spacer 216, as oriented in the drawing of FIG. 7B.

Figure 8A:
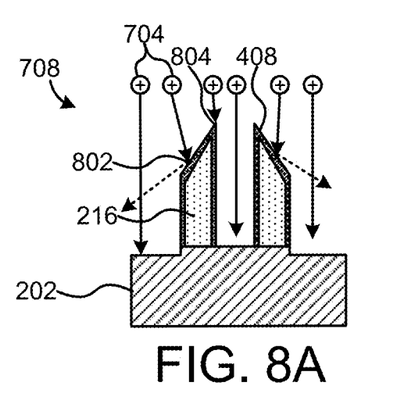
FIG. 8A is a schematic cross-section diagram illustrating one embodiment of a work piece illustrating an embodiment of a spacer reshaping process for enhanced formation of a feature in a substrate.
Figure 8B:
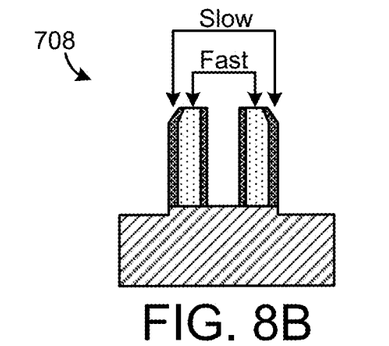
FIG. 8B is a schematic cross-section diagram illustrating one embodiment of a work piece illustrating an embodiment of a spacer reshaping process for enhanced formation of a feature in a substrate.
Figure 8C:
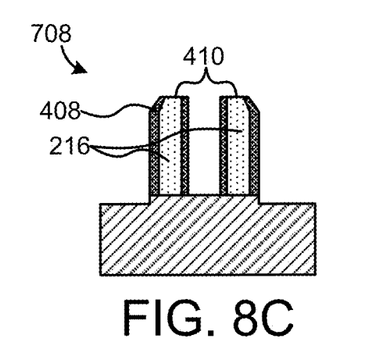
FIG. 8C is a schematic cross-section diagram illustrating one embodiment of a work piece illustrating an embodiment of a spacer reshaping process for enhanced formation of a feature in a substrate.

FIGS. 8A-8C illustrate further details of the mechanism of an embodiment of the reshaping treatment 406 shown in FIG. 4. As illustrated, the ionic elements 704 of the plasma field 702 may strike the spacer 216 at various locations as shown in FIG. 7. Ionic elements 704 that strike a first location 802, which may be a sloped or angled region of the spacer 216, may simply bounce off the spacer as illustrated. However, ionic elements 704 that strike a second region 804, such as the tip of the spacer 216, may penetrate the passivation layer 408 and begin etching the spacer material. As illustrated in FIG. 8B, the spacer material may etch faster than the passivation material because of the etch gas chemistry selected. The result, as shown in FIG. 8C, may be spacer 216 with a substantially flattened distal end.

Figure 9:
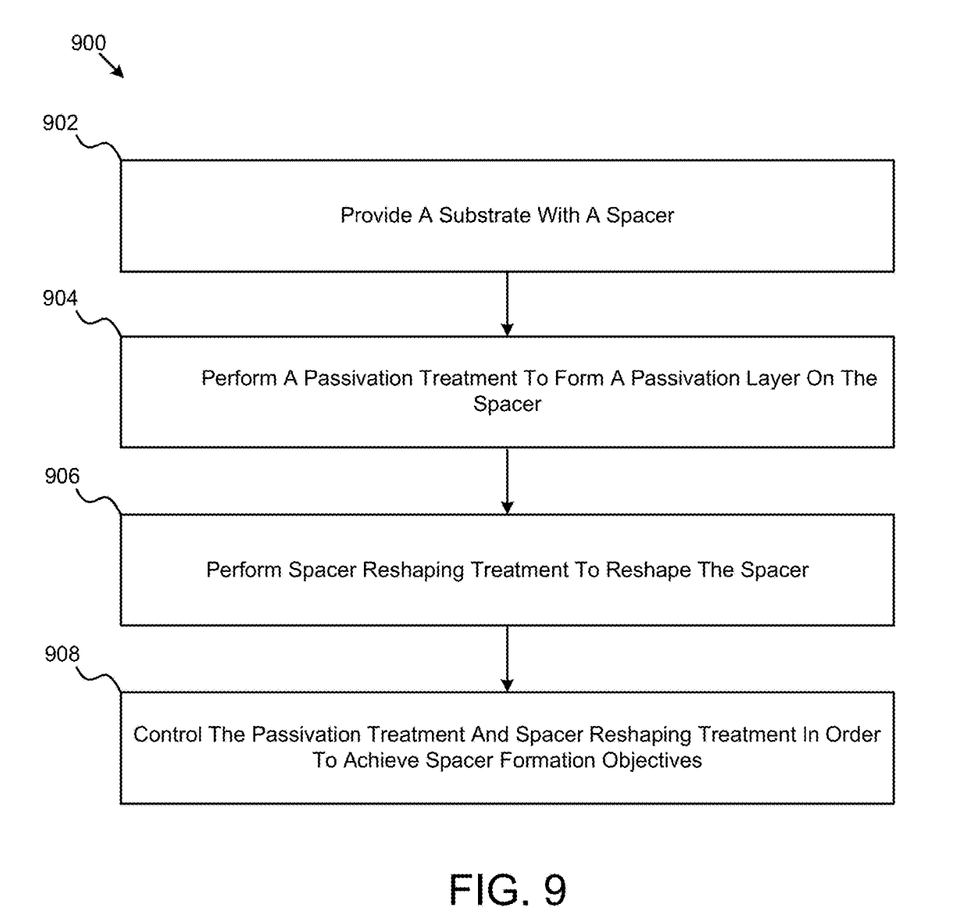
FIG. 9 is a schematic flowchart diagram illustrating one embodiment of a method for in-situ spacer reshaping for self-aligned multi-patterning.

FIG. 9 is a schematic flowchart diagram illustrating one embodiment of a method 900 for in-situ spacer reshaping for self-aligned multi-patterning. In an embodiment, a method 900 of forming a spacer pattern on a substrate may include providing a substrate with a spacer, as shown at block 902. At block 904, the method 900 may also include performing a passivation treatment to form a passivation layer on the spacer. Additionally, the method 900 may include performing spacer reshaping treatment to reshape the spacer, as shown at block 906. The method 900 may also include controlling the passivation treatment and spacer reshaping treatment in order to achieve spacer formation objectives, as shown at block 908.

Figure 10:
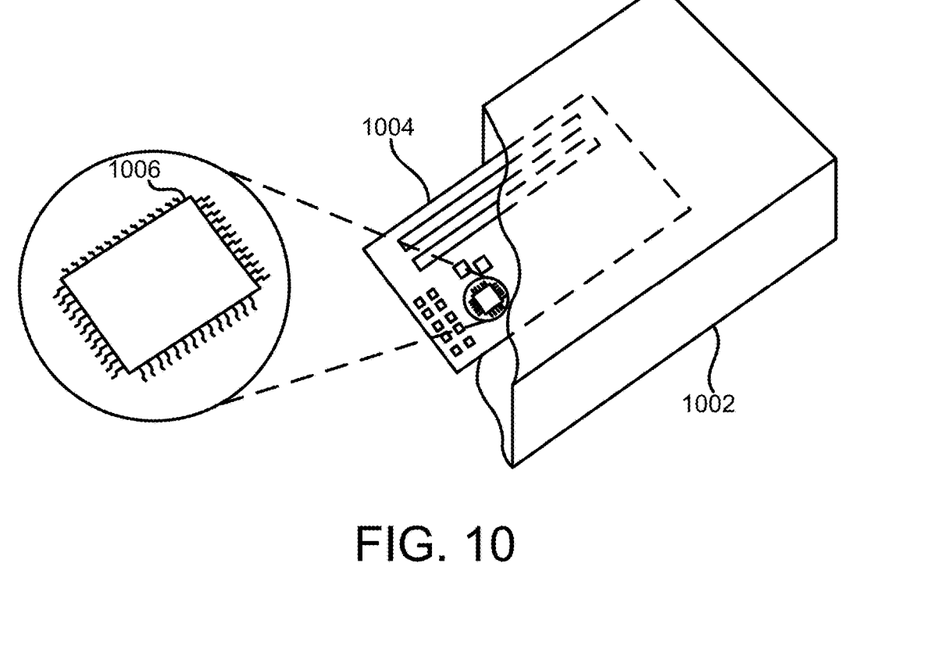
FIG. 10 is a cut-away view diagram illustrating one embodiment of a system having a device formed by a method for in-situ spacer reshaping for self-aligned multi-patterning.

The embodiments of the processes and methods described herein may be used in commercial processes for manufacturing semiconductor-based products for inclusion in commercial products. For example, FIG. 10 illustrates an electrical device 1002 comprising a printed circuit board (PCB). The electrical device 1002 may be one of several commercially available products, including for example, computers, computer monitors, televisions, audio amplifiers, cameras, smartphones and personal data assistants, tablet computing devices, smart watches, application-specific processing equipment, sensor devices, medical devices, etc. One of ordinary skill will recognize that devices manufactured according to the present embodiments are not limited to any particular field.

The electrical device 1002 may include one or more PCBs 1004, the PCBs 1004 comprising one or more semiconductor-based electrical components, such as chip package 1006. Chip package 1006 may include a segmented chip of a wafer having one or more features, such as the FinFET device manufactured according to the processes described in FIGS. 2A-9 disposed thereon. The chip may comprise, for example, a substrate 200. The chip may be packaged in a durable package for protection of the features disposed thereon. The chip package 1006 may further include one or more contact pins configured to provide external access to certain contact points on the chip.

Advantageously, the size and density of the features disposed on the chip in chip package 1006 may be small relative to devices manufactured with other techniques, because use of the passivation treatment 404 and the spacer reshaping treatment 406 allows for high resolution patterning of the semiconductor device, relative to previous methods.

Additional advantages and modifications will readily appear to those skilled in the art. The invention in its broader aspects is therefore not limited to the specific details, representative apparatus and method, and illustrative examples shown and described. Accordingly, departures may be made from such details without departing from the scope of the general inventive concept.

What we claim:

1. A method of forming a spacer pattern on a substrate, the method comprising:
   providing a substrate with a spacer core and a conformal layer formed on the spacer core;
   etching the conformal layer to produce a spacer comprising a spacer material selected from silicon, silicon oxide, silicon nitride, metal oxide or metal nitride;
   performing a passivation treatment to form a passivation layer on a top surface and sidewall surfaces of the spacer, wherein the passivation layer comprises a passivation material selected from a nitride or an oxide, and wherein the passivation material is different than the spacer material;
   performing a spacer reshaping treatment to reshape the spacer, wherein the spacer reshaping treatment includes a plasma etch to break through the passivation layer formed on the top surface and then etch the top surface of the spacer at a faster rate than the passivation layer; and
   controlling the passivation treatment and spacer reshaping treatment in order to achieve spacer formation objectives.

2. The method of claim 1, wherein the passivation material is an oxide.

3. The method of claim 2, wherein the spacer material is silicon nitride or metal nitride.

4. The method of claim 1, wherein the passivation material is a nitride.

5. The method of claim 4, wherein the spacer material is silicon oxide or metal oxide.

6. The method of claim 1, wherein performing the passivation treatment comprises performing chemical vapor deposition process.

7. The method of claim 6, wherein the chemical vapor deposition process is plasma assisted.

8. The method of claim 7, wherein the passivation treatment is performed using a plasma gas chemistry comprising a gas selected from the group consisting of $N_2$, $O_2$, CO, $CO_2$, $H_2$, $C_xH_y$, $C_xH_yF_z$, Ar, and He.

9. The method of claim 1, wherein the plasma etch is performed using a plasma etch gas chemistry comprising a plasma etch gas selected from the group consisting of $N_2$, $O_2$, CO, $CO_2$, $H_2$, HBr, $Cl_2$, $C_xH_y$, Ar, He, $C_xH_yF_z$, and $C_xF_y$.

10. The method of claim 9, wherein the plasma etch is performed using a mixture of $CHF_3$, $O_2$, and Ar.

11. The method of claim 1, wherein the spacer reshaping treatment further comprises flattening an end of the spacer that is distal to the substrate.

12. The method of claim 1, wherein the spacer is formed proximate a hardmask layer.

13. The method of claim 12, further comprising etching the hardmask layer in a pattern defined by the spacer.

14. The method of claim 13, wherein etching the hardmask layer is performed using a plasma etch gas chemistry comprising a plasma etch gas selected from the group consisting of $N_2$, $O_2$, CO, $CO_2$, $H_2$, HBr, $Cl_2$, $C_xH_y$, Ar, He, $C_xH_yF_z$, and $C_xF_y$.

15. The method of claim 14, further comprising etching the substrate in a pattern defined by the hardmask layer for forming a physical structure in the substrate.

16. The method of claim 15, wherein etching the substrate is performed using a plasma etch gas chemistry comprising a plasma etch gas selected from the group consisting of $N_2$, $O_2$, CO, $CO_2$, $H_2$, HBr, $Cl_2$, $C_xH_y$, Ar, He, $C_xH_yF_z$, and $C_xF_y$.

17. The method of claim 1, wherein forming the spacer pattern comprises a Self-Aligned Multi-Patterning (SAMP) technique for forming a fin-type field effect transistor (FinFET) structure.

18. The method of claim 17, wherein the FinFET comprises a sub-22 nm transistor architecture.

19. The method of claim 1, wherein the spacer core comprises at least one of silicon, amorphous carbon, photoresist, an oxide, and a nitride, and during etching, the space core is etched.

20. The method of claim 3, wherein the spacer core comprises at least one of silicon, amorphous carbon, photoresist, and an oxide, and during etching, the spacer core is etched.

21. The method of claim 5, wherein the spacer core comprises at least one of silicon, amorphous carbon, photoresist, and a nitride, and during etching, the spacer core is etched.

* * * * *

UNITED STATES PATENT AND TRADEMARK OFFICE
CERTIFICATE OF CORRECTION

PATENT NO. : 10,453,686 B2  
APPLICATION NO. : 15/486928  
DATED : October 22, 2019  
INVENTOR(S) : Eric Chih-Fang Liu et al.

Page 1 of 1

It is certified that error appears in the above-identified patent and that said Letters Patent is hereby corrected as shown below:

In the Specification

Column 1, Line 28, "shrinkage is a one of the driving forces" should be --shrinkage is one of the driving forces--.

Column 2, Lines 4-5, "and perform performing spacer reshaping" should be --and perform spacer reshaping--.

Column 7, Line 41, "been found between core and space sites during" should be --been found between core and spacer sites during--.

In the Claims

Column 10, Lines 61-63, Claim 6, "The method of claim 1, wherein performing the passivation treatment comprises performing chemical vapor deposition process" should be --The method of claim 1, wherein performing the passivation treatment comprises performing a chemical vapor deposition process--.

Column 12, Lines 12-14, Claim 19, "comprises at least one of silicon, amorphous carbon, photoresist, an oxide, and a nitride, and during etching, the space core is etched." should be --comprises at least one of silicon, amorphous carbon, photoresist, an oxide, and a nitride, and during etching, the spacer core is etched.--.

Signed and Sealed this  
Twenty-ninth Day of September, 2020

Andrei Iancu  
*Director of the United States Patent and Trademark Office*